(12) United States Patent
Feyh et al.

(10) Patent No.: US 9,638,524 B2
(45) Date of Patent: May 2, 2017

(54) CHIP LEVEL SENSOR WITH MULTIPLE DEGREES OF FREEDOM

(71) Applicants: Ando Feyh, Palo Alto, CA (US); Po-Jui Chen, Sunnyvale, CA (US)

(72) Inventors: Ando Feyh, Palo Alto, CA (US); Po-Jui Chen, Sunnyvale, CA (US)

(73) Assignee: Robert Bosch GmbH, Stuttgart (DE)

( * ) Notice: Subject to any disclaimer, the term of this patent is extended or adjusted under 35 U.S.C. 154(b) by 713 days.

(21) Appl. No.: 13/690,932

(22) Filed: Nov. 30, 2012

(65) Prior Publication Data

US 2014/0150552 A1  Jun. 5, 2014

(51) Int. Cl.
*G01C 19/5712* (2012.01)
*B81B 7/02* (2006.01)
*G01P 15/12* (2006.01)
*G01C 19/5755* (2012.01)
*G01C 19/5769* (2012.01)
*G01P 15/125* (2006.01)
*G01C 25/00* (2006.01)
*G01P 15/08* (2006.01)
*G01P 15/18* (2013.01)

(52) U.S. Cl.
CPC ............ *G01C 19/5712* (2013.01); *B81B 7/02* (2013.01); *G01C 19/5755* (2013.01); *G01C 19/5769* (2013.01); *G01C 25/00* (2013.01); *G01P 15/123* (2013.01); *G01P 15/125* (2013.01); *G01P 15/18* (2013.01); *B81B 2201/0235* (2013.01); *B81B 2201/0242* (2013.01); *B81B 2207/053* (2013.01); *G01P 2015/0808* (2013.01); *G01P 2015/0814* (2013.01); *G01P 2015/0848* (2013.01); *G01P 2015/0882* (2013.01); *Y10T 29/42* (2015.01)

(58) Field of Classification Search
CPC ............ G01C 19/5712; G01C 19/5755; G01C 19/5769; G01C 25/00; B81B 7/02; B81B 2207/053; B81B 2201/0235; B81B 2201/0242; G01P 15/123; G01P 15/125; G01P 15/18; G01P 2015/0814; Y10T 29/42
USPC ............... 73/504.01–504.16, 514.17–514.18, 73/514.13, 514.38; 29/25.35
See application file for complete search history.

(56) References Cited

U.S. PATENT DOCUMENTS 3,842,681 A * 10/1974 Mumme .................... 73/504.15
5,618,989 A *  4/1997 Marek ............................ 73/1.38
(Continued)

FOREIGN PATENT DOCUMENTS

GB      2246635 A     2/1992
WO   2012037539 A1   3/2012

OTHER PUBLICATIONS

International Search Report and Written Opinion corresponding to PCT Application No. PCT/US2013/072360, mailed Feb. 6, 2014 (14 pages).

(Continued)

*Primary Examiner* — Lisa Caputo
*Assistant Examiner* — Anthony W Megna Fuentes
(74) *Attorney, Agent, or Firm* — Maginot Moore & Beck LLP

(57) ABSTRACT

A sensing assembly device includes a substrate, a chamber above the substrate, a first piezoelectric gyroscope sensor positioned within the chamber, and a first accelerometer positioned within the chamber.

18 Claims, 3 Drawing Sheets

(56) References Cited

U.S. PATENT DOCUMENTS

| | | | |
|---|---|---|---|
| 6,546,801 B2* | 4/2003 | Orsier | B81B 3/0051 73/514.29 |
| 6,777,857 B1 | 8/2004 | Yang | |
| 7,028,547 B2 | 4/2006 | Shiratori et al. | |
| 7,159,459 B2* | 1/2007 | Gogoi | 73/504.02 |
| 7,907,838 B2 | 3/2011 | Nasiri et al. | |
| 8,637,943 B1* | 1/2014 | Yang | 257/414 |
| 2004/0058797 A1* | 3/2004 | Nonoyama | C04B 35/495 501/134 |
| 2004/0099069 A1* | 5/2004 | Osentoski | G01P 3/486 73/865.3 |
| 2004/0182155 A1* | 9/2004 | Najafi et al. | 73/514.32 |
| 2004/0245586 A1* | 12/2004 | Partridge et al. | 257/414 |
| 2005/0022402 A1* | 2/2005 | Ash et al. | 33/321 |
| 2006/0056830 A1* | 3/2006 | Tanaka et al. | 396/55 |
| 2006/0169041 A1 | 8/2006 | Madni et al. | |
| 2006/0175938 A1* | 8/2006 | Imamura et al. | 310/348 |
| 2007/0193380 A1* | 8/2007 | Klein et al. | 73/866.1 |
| 2008/0202239 A1 | 8/2008 | Fazzio et al. | |
| 2010/0307241 A1 | 12/2010 | Raman et al. | |
| 2011/0219875 A1 | 9/2011 | Walther et al. | |
| 2011/0265568 A1* | 11/2011 | Stephanou et al. | 73/514.32 |
| 2011/0296918 A1* | 12/2011 | Yao et al. | 73/514.34 |

OTHER PUBLICATIONS

Najafi B. et al., An Ambulatory System for Physical Activity Monitoring in Elderly, 1st Annual International IEEE—EMBS Special Topic Conference on Microtechologies in Medicine and Biology, Jan. 1, 2000, pp. 562-566, Lyon, France (5 pages).

Simcox, Scott et al., Performance of Orientation Sensors for use with a Functional Electrical Stimulation Mobility System, Journal of Biomechanics, May 1, 2005, pp. 1185-1190, vol. 38, No. 5, Pergamon Press, New York, NY (6 pages).

Pons, J.L. et al., Biomedical Instrumentation Based on Piezoelectric Ceramics, Journal of the European Ceramic Society, Jan. 1, 2007, pp. 4191-4194, vol. 27, No. 13-15, Elsevier Science Publishers, Barking, Essex, GB (4 pages).

Liu, Kai et al., Topical Review: The Development of Micro-gyroscope Technology, Journal of Micromechanics and Microengineering, Nov. 1, 2011, p. 113001, vol. 19, No. 11, Institute of Physics Publishing, Bristol, GB (29 pages).

Invensense, "MPU-6000 and MPU-6050 Product Specification Revision 2.2," Released Aug. 5, 2011, pp. 1-59, USA (59 pages).

Invensense webpage, "MPU-6000/6050: World's First Integrated 3-Axs Gyro, 3-Axis Accel and 9-Axis MotionFusion," http://invensense.com/means/gyro/mpu6000.html., published at least as early as Aug. 25, 2011 (2 pages).

Johnson, "MEMS gyro/accelerometer combo chip debuts," http://www.eetimes.com/General/DisplayPrintViewContent?contentItemId=4210545, published at least as early as Aug. 25, 2011 (3 pages).

Johnson, "Epson IMU melds precision, low cost," http://www.eetimes.com/General/DisplayPrintViewContent?contentItemId=4216626, published at least as early as Aug. 25, 2011 (2 pages).

ST, "MEMS motion sensor module: 3D digital accelerometer and 2D pitch and yaw analog gyroscope," www.st.com, Dec. 2009, Switzerland (42 pages).

* cited by examiner

CHIP LEVEL SENSOR WITH MULTIPLE DEGREES OF FREEDOM

FIELD

This disclosure relates to structures and substrates such as are used in micromechanical electrical system (MEMS) devices or semiconductor devices.

BACKGROUND

MEMS devices frequently operate based upon reactions to applied forces, pressures, and loads. In many systems, the manner in which a membrane or structure is deformed or deflected is used as a sensing or actuating function. Such deformation includes expansion and contraction, longitudinal bending, transversal bending, and torsional bending. Specific structural deformation is required in some specialized devices. For example, in Coriolis-effect-based MEMS vibratory gyroscopes incorporating a vibrating-plate topology concept, translational motion of a proof mass in drive direction is relied upon to provide accurate sensing functions. Any motion of the proof mass that is not purely within the drive direction can affect the accuracy of the device.

In many devices which incorporate a proof mass, movement of the proof mass is detected using electrostatic forces induced by capacitive comb drives or parallel plates and applied to either the proof mass or the proof mass frame, depending upon the particular device design. Movement of the proof mass along the drive direction is then sensed or effected while the proof mass is supported by a mechanical support such as a beam.

In many applications, different types of inertial sensor are incorporated. For example, it is beneficial to incorporate both accelerometers which sense linear motion along acceleration vectors $a_x$, $a_y$, and $a_z$, along with gyroscopes which detect rotational motion by angular rate vectors $\Omega_x$, $\Omega_y$, and $\Omega_z$. Such devices are typically referred to as six degrees of freedom or "6-DoF" sensors. From a system point of view, it would be beneficial to incorporate accelerometers and gyroscopes on a single integrated semiconductor chip. Such integration, however, is problematic.

Specifically, gyroscopes designed using a micromechanical vibratory principle of operation are permanently driven. Accordingly, a high quality factor in resonance is needed. In order to achieve a high quality factor in known devices, a low residual pressure is needed in the encapsulated chamber in which the seismic mass is located. Accelerometers designed using a micromechanical vibratory principle of operation, however, require a high damping to provide short time-scale sensitivity. Consequently, known accelerometers require a low quality factor. In order to achieve a low quality factor in known devices, a high residual pressure is needed in the encapsulated chamber in which the seismic mass is located.

Because of the conflicting quality factors, integrated sensors with gyroscopes and accelerometers require complex processing. In one approach, a system-in-package (SiP) solution includes assembling two different encapsulated chambers with two different pressures for two different MEMS elements in a single package. As an alternative to the SiP approaches, system-on-chip (SoC) approaches have been used. Known SoC approaches, however, suffer from a variety of problems. Such problems include cross-sensitivity issues, and increased processing requirements.

Consequently, commercially available sensors typically do not provide for 6-DoF. The above identified issues are further compounded when a system also requires geomagnetic field sensors which provide angle vectors $\theta_x$, $\theta_y$, and $\theta_z$ (or a nine DoF or "9-DoF" sensor).

What is needed therefore is a system and method of forming a system that provides a 6-DoF sensor which is simple to manufacture. A system and method of forming a system that provides a 9-DoF sensor would be further beneficial. It would be beneficial if the system and method of forming a system could be accomplished using known MEMS manufacturing processes.

SUMMARY

In one embodiment, a sensing assembly device includes a substrate, a chamber above the substrate, a first piezoelectric gyroscope sensor positioned within the chamber, and a first accelerometer positioned within the chamber.

In another embodiment, a method of forming a sensing assembly device includes providing a substrate, forming a first piezoelectric gyroscope sensor above the substrate, forming a first accelerometer positioned above the substrate, and forming a chamber above the substrate such that the first piezoelectric gyroscope sensor and the first accelerometer are within the chamber.

DESCRIPTION

Figure 1:
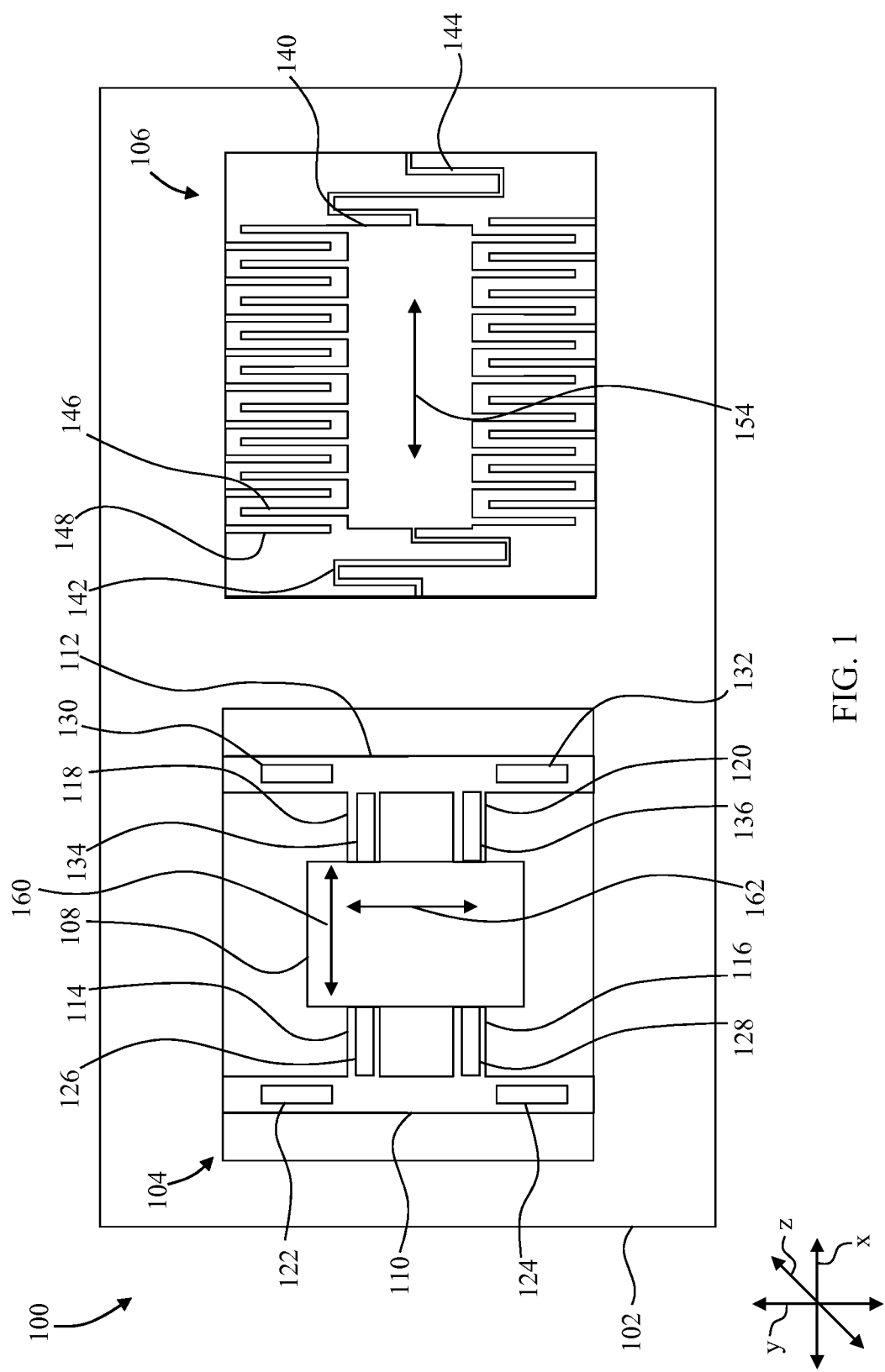
FIG. 1 depicts a top plan view of a MEMS device with a laterally (horizontally) integrated piezoelectric gyroscope and capacitive accelerometer within a single pressure chamber in accordance with principles of the invention.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one skilled in the art to which this disclosure pertains.

FIG. 1 is a top plan view of a MEMS sensor assembly device 100 in an x-y plane. The MEMS sensor assembly device 100 includes a substrate 102 on which a piezoelectric gyroscope sensor 104 and a capacitive accelerometer 106 are formed. The piezoelectric gyroscope sensor 104 includes a seismic mass 108 (alternatively referred to as a "body portion") that is suspended above the substrate 102 by a pair of primary support beams 110/112. A pair of secondary support beams 114 and 116 extends between the primary support beam 110 and the seismic mass 108 while another pair of secondary support beams 118 and 120 extends between the primary support beam 112 and the seismic mass 108.

Two piezoelectric drive elements 122 and 124 are provided on the primary support beam 110 while two piezoelectric sense elements 126 and 128 are provided on the secondary support beams 114 and 116, respectively. Two more piezoelectric drive elements 130 and 132 are provided on the primary support beam 112 while two additional piezoelectric sense elements 134 and 136 are provided on the secondary support beams 118 and 120, respectively.

The capacitive accelerometer 106 includes a body portion or seismic mass 140 which is supported above the substrate 102 by a pair of suspension members 142 and 144. A number of plates 146 extend away from the body portion 140 and are interdigitated with fixed plates 148.

Figure 2:
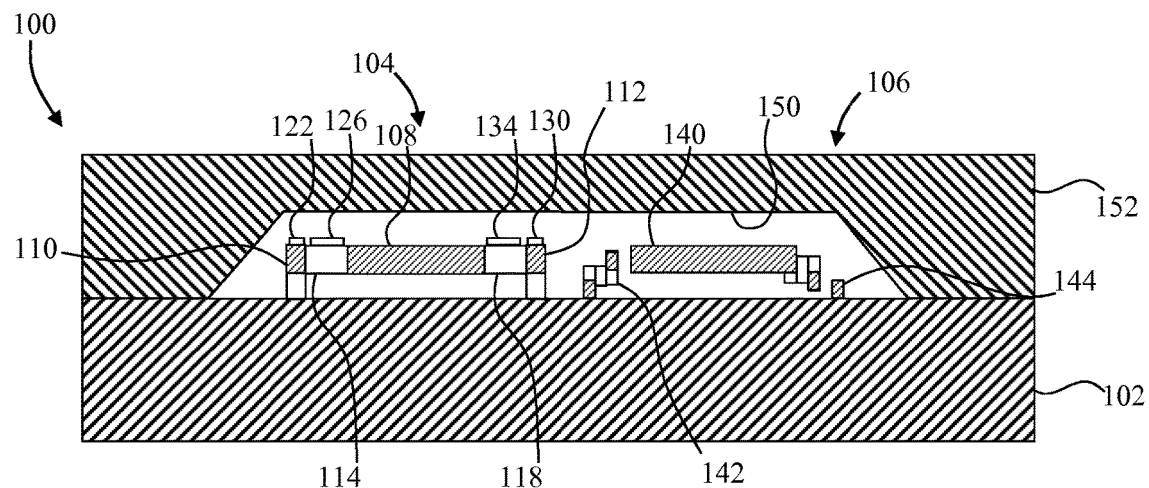
FIG. 2 depicts a side cross sectional view of the device of FIG. 1.

The piezoelectric gyroscope 104 and the capacitive accelerometer 106 are contained within a chamber 150 (see FIG. 2). The chamber 150 is defined by the substrate 102 and a cap 152. The chamber 150 is pressurized to a pressure sufficient to provide the desired damping for the accelerometer 106.

The accelerometer 106 is operated by applying a signal across the plates 146/148 to create a capacitor. If an acceleration of the sensor 100 along the x-axis occurs (arrow 154 of FIG. 1), the seismic mass 140 (and the plates 146) initially remains in its initial position as the substrate 102 and the plates 148 move with the sensor 100. The relative movement of the plates 146/148 results in a change in capacitance of the capacitor defined by the plates 146/148. The change in capacitance is used to quantify the acceleration of the sensor 100 along the x-axis.

Once acceleration of the sensor 100 along the x-axis terminates the pressurized environment of the chamber 150 acts upon the plates 146 to dampen the movement of the seismic mass 140.

Referring to the piezoelectric gyroscope 104, the drive elements 122, 124, 130, and 132 are controlled to force the mass 108 to vibrate along the x-axis as indicated by the double sided arrow 160 in FIG. 1. As the mass 108 is vibrating along the x-axis, any angular rate of the sensor 100 in the x-y plane causes the mass 108 to move along the y-axis as a result of the Coriolis force, resulting in a linear movement of the mass 108 as indicated by the arrow 162. The movement of the mass 108 along the y-axis is sensed using the piezoelectric sense elements 126, 128, 130, and 132.

While the pressurized environment within the chamber 150 also acts upon the mass 108, thereby dampening response to the angular rate of the sensor 100, the mass 108 does not include high surface area structures such as the plates 146. Accordingly, the amount of dampening experienced by the piezoelectric gyroscope 104 is much less than the dampening of the capacitive accelerometer 106. Consequently, the quality factor of the piezoelectric gyroscope 104 is not unduly affected.

Figure 3:
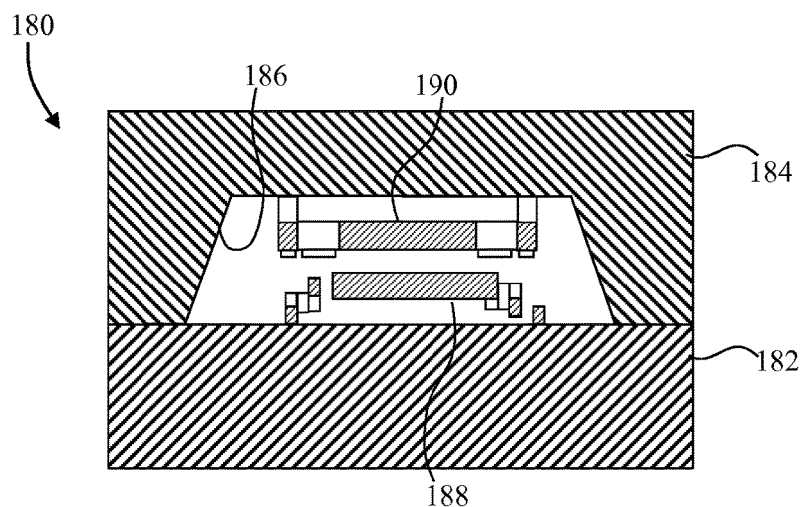
FIG. 3 depicts a side cross sectional view of a MEMS device with a vertically integrated gyroscope and accelerometer within a single pressure chamber in accordance with principles of the invention.

In the embodiment of FIG. 1, the piezoelectric gyroscope 104 and the capacitive sensor 106 are laterally integrated on the substrate 102. In other embodiments, sensors are additionally and/or alternatively integrated vertically as depicted in FIG. 3. The sensor assembly device 180 of FIG. 3 includes a substrate 182 and a cap 184 which define a chamber 186. A capacitive accelerometer 188 is supported by the substrate 182 while a piezoelectric gyroscope 190 is supported by the cap 184. The sensor assembly device 180 works in substantially the same way as the sensor assembly device 100.

Accordingly, multiple sensor types with different orientations may be provided in a single sensor assembly device within a single pressurized chamber. The number and orientation of the sensors within the sensor assembly device are selected to provide the desired degrees of freedom. Thus, in some embodiments, multiple one-axis sensors are used to provide the desired sensing functions up to 9 DOF. In other embodiments, one or more multiple-axis sensors are included. In other embodiments, a combination of single-axis and multiple-axis sensors is used.

Figure 4:
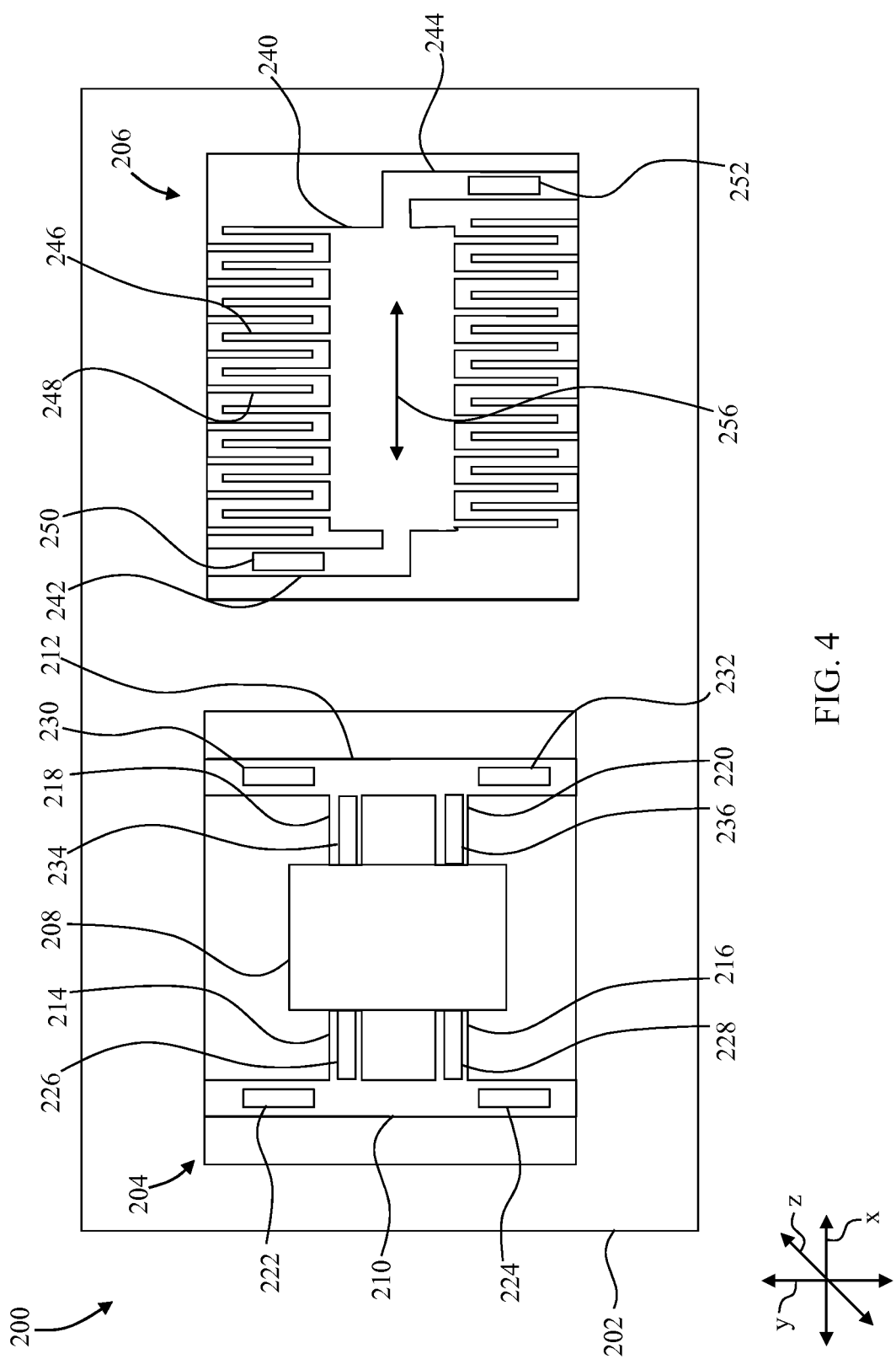
FIG. 4 depicts a top plan view of a MEMS device with a laterally (horizontally) integrated piezoelectric gyroscope and piezoelectric accelerometer within a single pressure chamber in accordance with principles of the invention.

Moreover, while the sensor assembly device 100 included a capacitive accelerometer 106, in some embodiments one or more capacitive accelerometers are replaced with piezoelectric accelerometers. FIG. 4 depicts one such sensor assembly device 200.

The MEMS sensor assembly device 200 includes a substrate 202 on which a piezoelectric gyroscope sensor 204 and a piezoelectric accelerometer 206 are formed. The piezoelectric gyroscope sensor 204 includes a seismic mass 208 that is suspended above the substrate 202 by a pair of primary support beams 210/212. A pair of secondary support beams 214 and 216 extends between the primary support beam 210 and the seismic mass 208 while another pair of secondary support beams 218 and 220 extends between the primary support beam 212 and the seismic mass 208.

Two piezoelectric drive elements 222 and 224 are provided on the primary support beam 210 while two piezoelectric sense elements 226 and 228 are provided on the secondary support beams 214 and 216, respectively. Two more piezoelectric drive elements 230 and 232 are provided on the primary support beam 212 while two additional piezoelectric sense elements 234 and 236 are provided on the secondary support beams 218 and 220, respectively.

The piezoelectric accelerometer 206 includes a seismic mass 240 which is supported above the substrate 202 by a pair of suspension members 242 and 244. A number of plates 246 extend away from the seismic mass 240 and are interdigitated with fixed plates 248. Piezoelectric sense elements 250 and 252 are respectively located on the suspension members 242 and 244.

The piezoelectric gyroscope 204 and the capacitive accelerometer 206 are contained within a chamber (not shown). The chamber (not shown), which in some embodiments is like the chamber 150, is pressurized to a pressure sufficient to provide the desired damping for the accelerometer 206.

The piezoelectric gyroscope 204 operates in substantially the same manner as the piezoelectric gyroscope 104. Operation of the piezoelectric accelerometer 206, however, is different from operation of the capacitive accelerometer 106. Specifically, no signal is established across the plates 246/248 to create a capacitor. Rather, if an acceleration of the sensor 200 along the x-axis occurs (arrow 256), the seismic mass 240 (and the plates 246) initially remains in its initial position as the substrate 202 and the plates 248 move with the sensor 200. The suspension members 242 and 244 are consequently contorted, and the contortion is detected using the sense elements 250 and 252. The output from the sense elements 250 and 252 is used to quantify the acceleration of the sensor 100 in the x-axis.

Once acceleration of the sensor assembly device 200 along the x-axis terminates the pressurized environment of the chamber (not shown) acts upon the plates 246 to dampen the movement of the mass 240. The plates 248 (like the plates 148 in the sensor assembly device 100) assist in dampening movement of the mass 240. Accordingly, the plates 246/248 are provided for dampening, not for sensing, in the sensor assembly device 200 of FIG. 4. Thus, the plates 246/248 need not be formed by any specific process such as DRIE process, since the main requirement is to have a high surface area for gas/solid dampening and the angle of the side walls is less significant. Moreover, because both of the sensors 204 and 206 use piezoelectric sense elements, the same readout scheme can be used for both of the sensors 204 and 206.

Additionally, since the plates 246/248 are not used for sensing, the plates 246/248 can be used to provide desired mechanical characteristics, such as tuning the mechanical performance of the sensor assembly device. For example, the plates 248/246 can be used to provide electrical stiffness for the accelerometer 206, thereby modifying the equivalent spring constant of the system. A control system is provided in some embodiments to allow adjusting of the stiffness of the accelerometer.

In accordance with the above described embodiments, combinations of accelerometers and gyroscopes can be positioned within a single encapsulation, operating in a common environment. Thus, in various embodiments, a sensor assembly device including up to 6 DOF and even 9 DOF is provided. The sensor assembly device in different embodiments is realized on bonded substrates and monolithic substrates. Any desired method of manufacturing and a wide variety of materials may be used. For example, the structural layers (e.g., the support beams, suspension members, proof mass, etc.) can be formed of silicon, piezoelectric materials like AlN or PZT, etc.

The above described sensor assembly devices are formed in some embodiments by providing a substrate forming a piezoelectric gyroscope sensor and an accelerometer above the substrate, and forming a chamber above the substrate such that the piezoelectric gyroscope sensor and the accelerometer are within the chamber.

An environment within the chamber in some embodiments is established by forming a cap over a portion of the substrate within a room maintained at the desired environment. In other embodiments, after a chamber is formed, the environment within the chamber is established such as by diffusion of gas into the chamber.

When forming the accelerometer, the body and plates of the accelerometer in some embodiments are formed coincidentally with the fixed plates, and then an etching process us used to free the body and plates from the substrate or cap.

In some embodiments, a number of sensors are simultaneously formed either within a chamber or at locations which are subsequently capped. In some embodiments, a first group of sensors which are attached to the substrate are formed followed by forming of sensors on a cap, and the chamber is thereafter etched so as to release the first and second group of sensors.

In different embodiments, one or more of the accelerometers are formed as piezoelectric sensors. In some embodiments, one or more sensors are supported by the substrate. In other embodiments, one or more sensors are supported by the cap. In other embodiments, one or more sensors are supported by the cap and one or more sensors are supported by the substrate.

While the pressurized environment within the chamber 150 also acts upon the mass 108, thereby dampening response to the angular rate of the sensor 100 in the x-y plane, the mass 108 does not include high surface area structures such as the plates 146. Accordingly, the amount of dampening experienced by the piezoelectric gyroscope 104 is much less than the dampening of the capacitive accelerometer 106. Consequently, the quality factor of the piezoelectric gyroscope 104 is not unduly affected.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

The invention claimed is:

1. A sensing assembly device comprising: a substrate; a chamber above the substrate; a first piezoelectric gyroscope sensor positioned within the chamber; and a first accelerometer positioned within the chamber, wherein the chamber is pressurized to a pressure sufficient to provide damping for the first accelerometer; the first piezoelectric gyroscope comprises: a first and second support beam, each of the first and second support beams having a respective pair of piezoelectric drive elements; a first and second secondary support beams supported by the first support beam; a third and a fourth secondary support beam supported by the second support beam; a seismic mass supported by the first, second, third, and fourth secondary support beams; and four piezoelectric sense elements, each of the four piezoelectric sense elements located on a respective one of the first, second, third, and fourth secondary support beams.

2. The device of claim 1, further comprising:
a second piezoelectric gyroscope sensor positioned within the chamber; and
a second accelerometer positioned within the chamber.

3. The device of claim 2, further comprising:
a third piezoelectric gyroscope sensor positioned within the chamber; and
a third accelerometer positioned within the chamber, wherein:
the first piezoelectric gyroscope sensor is configured to sense rotation about a first axis;
the second piezoelectric gyroscope sensor is configured to sense rotation about a second axis;
the third piezoelectric gyroscope sensor is configured to sense rotation about a third axis; and
each of the first, second and third axis is orthogonal to each of the other of the first, second and third axis.

4. The device of claim 2, wherein the first accelerometer is a piezoelectric accelerometer.

5. The device of claim 4, the first accelerometer comprising:
a body portion movable with respect to the substrate; and
a plurality of first plates fixedly extending from the body portion and interdigitated with a plurality of second plates which are fixed with respect to the substrate.

6. The device of claim 5, further comprising:
a control system operably connected to the plurality of first plates and the plurality of second plates and configured to adjust the stiffness of the first accelerometer.

7. The device of claim 2, wherein the first accelerometer is a capacitive accelerometer.

8. The device of claim 1, further comprising a cap, wherein:
an inside surface of the cap defines a portion of the chamber;
the first accelerometer is attached to the substrate; and
the first piezoelectric gyroscope is attached to the inside surface of the cap.

9. The device of claim 1, further comprising a cap, wherein:
an inside surface of the cap defines a portion of the chamber;
the first accelerometer is attached to the inside surface of the cap; and
the first piezoelectric gyroscope is attached to the substrate.

10. The device of claim 1, wherein:
the first accelerometer is attached to the substrate; and
the first piezoelectric gyroscope is attached to the substrate.

11. The device of claim 1, wherein the first accelerometer is a multiple-axis sensor.

12. The device of claim 1, wherein the first piezoelectric gyroscope sensor is a multiple-axis sensor.

13. A method of forming a sensing assembly device comprising: providing a substrate; forming a first piezoelectric gyroscope sensor above the substrate; forming a first accelerometer positioned above the substrate; and forming a chamber above the substrate such that the first piezoelectric gyroscope sensor and the first accelerometer are within the chamber; wherein forming the first piezoelectric gyroscope sensor comprises: forming a first and a second support beam; forming a first pair of piezoelectric drive elements on the first support beam; forming a second pair of piezoelectric drive elements on the second support beam; supporting a first and a second secondary support beam with the first support beam; supporting a third and a fourth secondary support beam with the second support beam; supporting a seismic mass with the first, second, third, and fourth secondary support beams; positioning a first piezoelectric sense element on the first secondary support beam; positioning a second piezoelectric sense element on the second secondary support beam; positioning a third piezoelectric sense element on the third secondary support beam; and positioning a fourth piezoelectric sense element on the fourth secondary support beam.

14. The method of claim 13, further comprising;
establishing an environment within the chamber, the environment selected to provide damping to the first accelerometer.

15. The method of claim 14, further comprising:
forming a plurality of first plates on a body portion of the first accelerometer; and
forming a plurality of second fixed plates interdigitated with the plurality of first plates, such that the plurality of second fixed plates are located within the chamber and fixed with respect to the chamber while the body portion is movable with respect to the chamber when the chamber is formed.

16. The method of claim 13, further comprising:
forming a second piezoelectric gyroscope sensor above the substrate; and
forming a second accelerometer above the substrate, wherein forming a chamber above the substrate comprises forming the chamber such that the second piezoelectric gyroscope sensor and the second accelerometer are within the chamber.

17. The method of claim 16, wherein:
the first piezoelectric gyroscope sensor is configured to sense rotation about a first axis;
the second piezoelectric gyroscope sensor is configured to sense rotation about a second axis; and
the first axis is orthogonal to the second axis.

18. The method of claim 13, wherein:
forming a first piezoelectric gyroscope sensor comprises supporting the first piezoelectric gyroscope sensor with a cap defining a portion of the chamber; and
forming a first accelerometer comprises supporting the first accelerometer with the substrate.

\* \* \* \* \*